United States Patent [19]
Fullerton et al.

[11] Patent Number: 5,311,122
[45] Date of Patent: May 10, 1994

[54] RF TEST EQUIPMENT AND WIRE BOND INTERFACE CIRCUIT

[75] Inventors: Craig Fullerton, Chandler; Douglas J. Mathews, Mesa, both of Ariz.

[73] Assignee: Motorola, Inc., Schaumburg, Ill.

[21] Appl. No.: 801,142

[22] Filed: Dec. 2, 1991

[51] Int. Cl.$^5$ ............................................. G01R 31/28
[52] U.S. Cl. ............................. 324/158 R; 324/158 P; 371/22.6
[58] Field of Search ............ 324/158 R, 158 F, 158 P, 324/128, 73.1; 437/8; 371/22.6, 22.5; 257/48

[56] References Cited

U.S. PATENT DOCUMENTS

| | | | |
|---|---|---|---|
| 2,522,369 | 9/1950 | Guanella | 324/128 |
| 3,522,559 | 8/1970 | Evans | 324/128 |
| 4,419,626 | 12/1983 | Cedrone et al. | 324/158 F |
| 4,849,691 | 7/1989 | Siefers | 324/158 F |
| 4,956,602 | 9/1990 | Parrish | 324/158 R |
| 4,961,053 | 10/1990 | Krug | 324/158 R |
| 4,975,639 | 12/1990 | Hiwada et al. | 324/158 F |
| 5,003,253 | 3/1991 | Majidi-Ahy et al. | 324/158 F |

OTHER PUBLICATIONS

"Layout Rules for GHz-Probing", Cascade Microtech, Inc., P.O. Box 1589, Beaverton, Oregon 97075-1589, Copyright 1988 Cascade Microtech, Inc. (no month).

*Primary Examiner*—Ernest F. Karlsen
*Attorney, Agent, or Firm*—Val Jean F. Hillman

[57] ABSTRACT

An RF test equipment and wire bond interface circuit (150) for facilitating the on-wafer (100) testing of integrated circuits (120) has an electrical interface (102,104,106), for providing electrical coupling to the IC (120) and a low-pass filter structure connected between the electric interface (102,104,106) and the IC (120). The low-pass filter structure comprises a first inductive element (108) connected in series with the electrical interface (102,104,106) for simulating wire bond reactances, a second inductive element (114) connected in series with the first inductive element (108) for making contact with the IC (120) and at least one capacitor (110,112) connected between ground and a point common to both the first (108) and the second (114) inductive elements, for providing shunt capacitance and defining a Tee type low-pass matched filter at the input (121) and the output (123) of the IC (120). The RF test equipment and wire bond interface (150) assure the on-wafer performance of the IC (120) will correspond to its off-wafer performance, despite the addition of wire bonds (127,129 and 133,135).

17 Claims, 6 Drawing Sheets

RF TEST EQUIPMENT AND WIRE BOND INTERFACE CIRCUIT

FIELD OF THE INVENTION

This invention relates generally to testing integrated circuits (ICs), and more particularly to testing monolithic microwave integrated circuits (MMIC) at the wafer level.

BACKGROUND OF THE INVENTION

RF testing of monolithic microwave integrated circuits (MMIC) is advantageously accomplished at the wafer level, where automatic test equipment can rapidly verify the electrical performance of the MMIC, prior to its separation, bonding and packaging as an individual component. In this effort, an RF test probe is used to provide temporary electrical contact between the automatic test equipment and an MMIC element on a wafer. A disadvantage and limitation known in the prior art is that current RF test equipment fixtures do not simulate, at the wafer test level, the operating environment of an MMIC after it has been separated from the wafer, wire bound and packaged. As a result, wafer level performance characteristics are marginal at best.

It would be extremely advantageous therefore to provide, at the wafer level, an RF test equipment, and wire bond interface circuit which overcomes these shortcomings.

SUMMARY OF THE INVENTION

Briefly described, the present invention is an RF test equipment and wire bond interface circuit for facilitating the on-wafer testing of an integrated circuit (IC) The test equipment and wire bond interface circuit comprises an electrical interface, for providing electrical coupling to the IC under test and a low-pass filter structure, disposed between the electrical interface and the IC under test. The low-pass filter structure comprises a first inductive element connected in series with the electrical interface for simulating wire bond reactance and defining a portion of the circuit, a second inductive element connected in series with the first inductive element for making contact with the IC under test and further defining a portion of the circuit, and at least one capacitor connected between ground and a point common to both the first and the second inductive elements for providing shunt capacitance. Advantageously, when a test equipment robe makes contact with the electrical interface, the low-pass matched filter structure simulates wire bond reactances during RF testing.

BRIEF DESCRIPTION OF THE DRAWINGS

FIG. 3c depicts a schematic diagram equivalent circuit of the RF test equipment and wire bond interface circuit of FIG. 3a;

FIG. 4b depicts a schematic diagram equivalent circuit of the RF test equipment and wire bond interface circuit of FIG. 4a.

DETAILED DESCRIPTION OF THE PREFERRED EMBODIMENT

Figure 1:
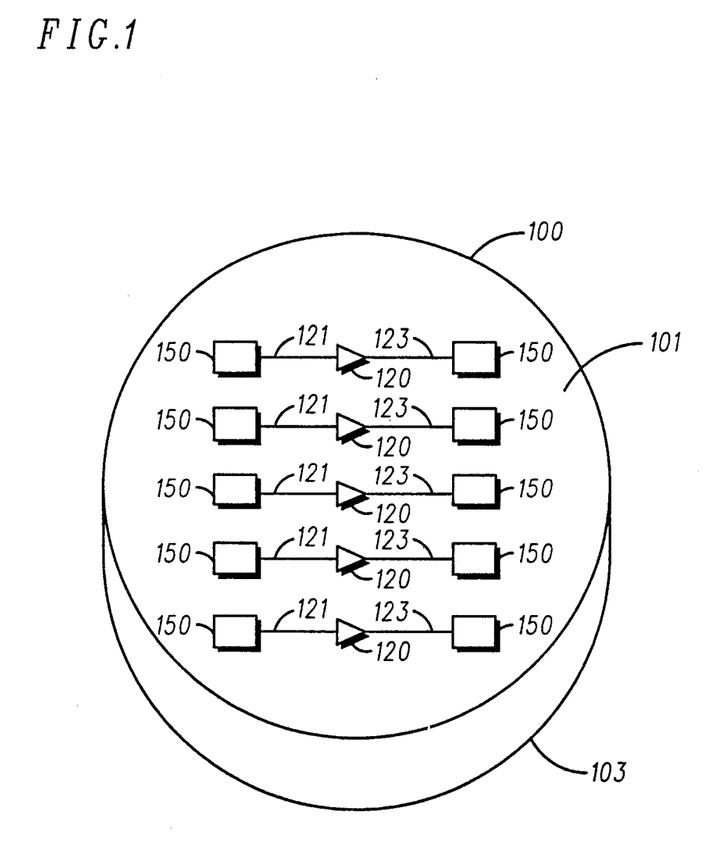
FIG. 1 depicts a wafer having a plurality of ICs disposed thereon.

FIG. 1 depicts a wafer 100 having a first 101 and second 103 flat parallel surface. Disposed on the first surface 101 are a plurality of ICs 120, each having an input 121 and an output 123. In accordance with the preferred embodiment, the ICs 120 are members of the Gallium Arsenide (GaAs) family of MMICs, capable of operating in the 1-60 gigahertz (GHz) range of frequencies. The wafer 100 houses the plurality of ICs 120, prior to their separation, bonding and packaging as individual components. Connected to the input 121 and the output 123, of each IC 120 is an RF test equipment and wire bond interface circuit 150 in accordance with the present invention.

Figure 2:
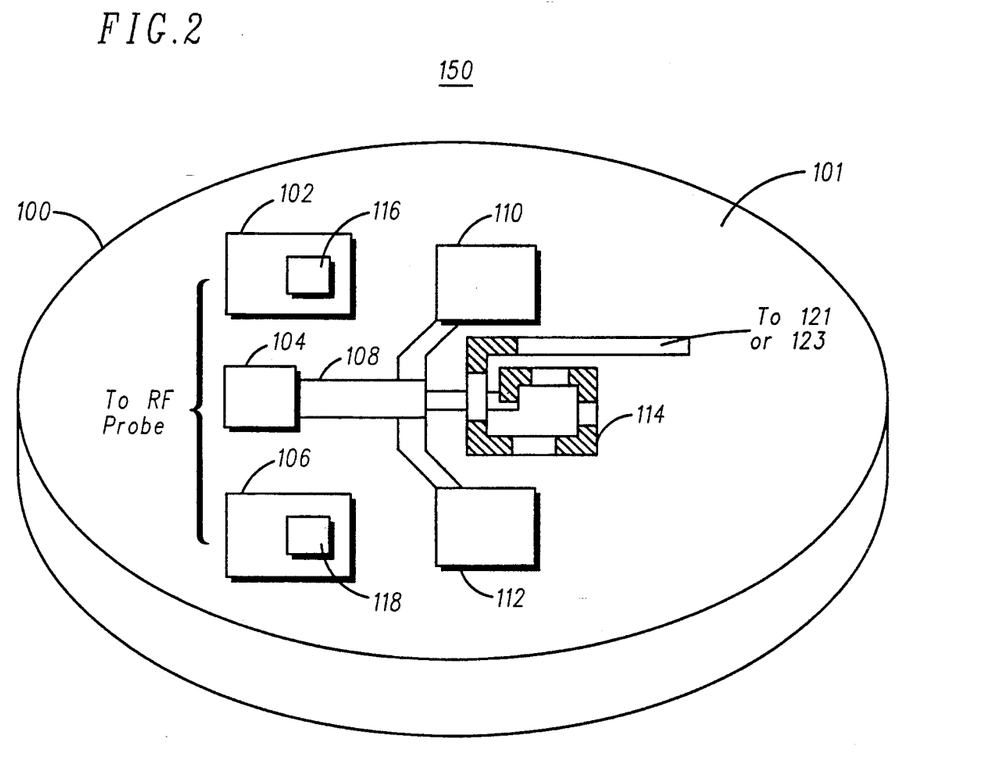
FIG. 2 depicts the RF test equipment and wire bond interface circuit in accordance with the present invention.

Referring to FIG. 2, the RF test equipment and wire bond interface circuit 150 is shown in detail. The RF test equipment and wire bond interface 150 comprises an electrical interface 102,104,106, a first inductive element 108, electrical contact pads 110,112 and a second inductive element 114 traced or otherwise disposed on the first surface 101 of the wafer 100. To facilitate microwave transmission, the second surface 103 of the wafer 100 is plated, thereby providing a ground plane in addition to electromagnetic interference (EMI) and radio frequency interference (RFI) shielding. Plated through holes or vias 116 and 118 bring the ground plane to the first surface 101 of the wafer 100. The combination of the interface connection traces 102-114 and the ground plane form transmission lines for microwave energy. The final assembly of these components forms an impedance matched low-pass filter structure at the input 121 and the output 123 of the IC 120.

A first feature of the present invention is that the RF test equipment and wire bond interface circuit 150 is incorporated into the IC design and therefore disposed on the wafer 100, in circuit with the IC 120. It is another feature of the present invention is that the RF test equipment and wire bond interface circuit 150 has a reactance which simulates wire bonds attached to the IC 120, as if the IC had been separated from the wafer 100. It is another feature of the present invention that the RF test equipment and wire bond interface circuit 150 is impedance matched with the impedance characteristic of the input 121 and output 123 of the IC 120. It is yet another feature of the present invention that the electrical interface is separate and distinct from wire bond contacts as shown and described below in association with FIGS. 2-4. It is therefore a primary advantage of the present invention that the disclosed RF test equipment and wire bond interface circuit 150 permits the on-wafer testing of the IC 120, under conditions which approximate the environment after the IC 120 is separated from the wafer 100, without disturbing the wire bond contact metallization.

Figure 3A:
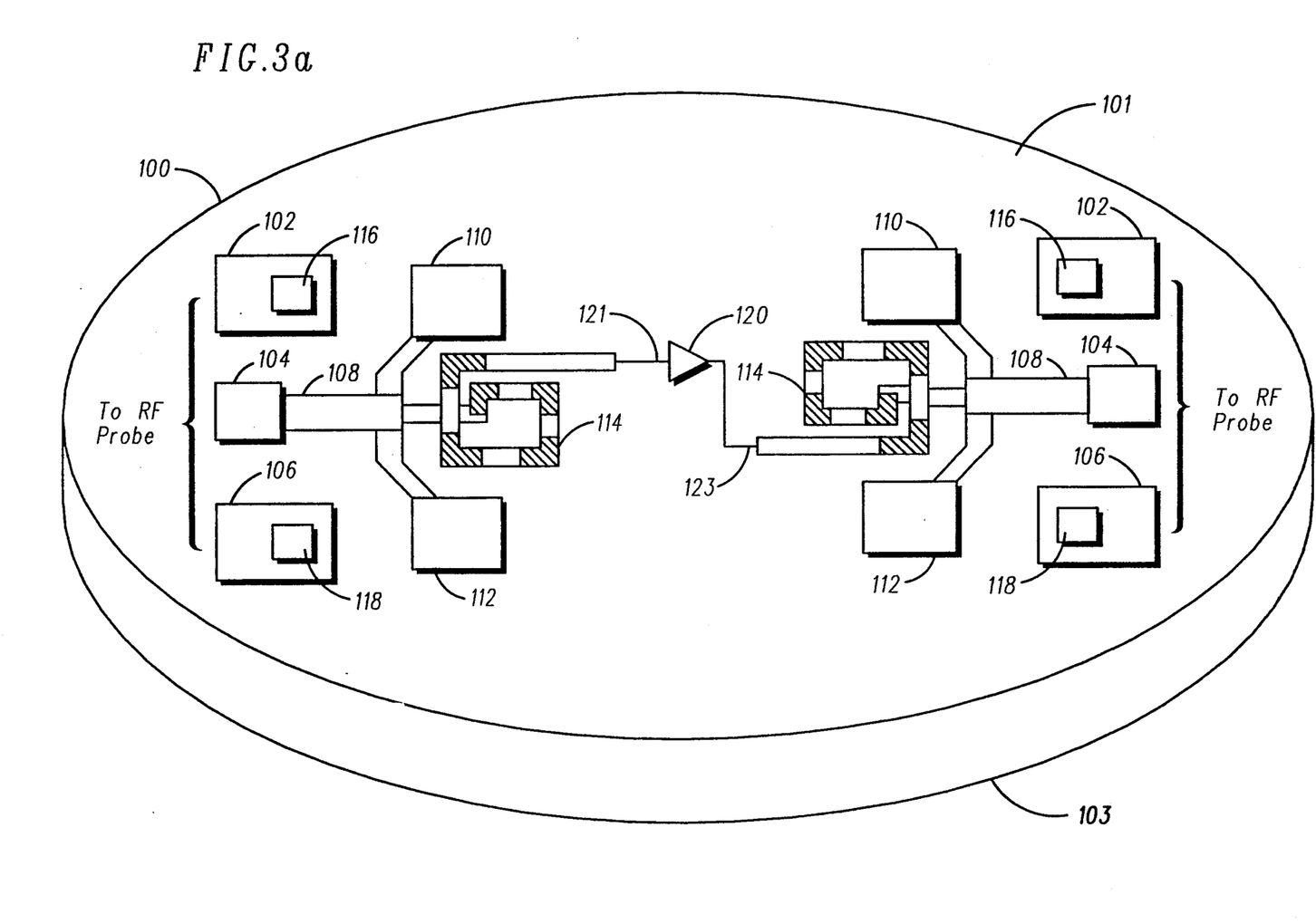
FIG. 3a depicts the RF test equipment and were bond interface circuit of FIG. 2, during wafer level testing.

FIG. 3a depicts the RF test equipment and wire bond interface circuit of FIG. 2, during wafer level testing. To facilitate on-wafer testing, an RF test equipment and wire bond interface circuit 150 is provided at the input 121 and the output 123 of an IC 120. As previously suggested, each RF test equipment and wire bond interface circuit 150 has an electrical interface. In accordance with the preferred embodiment, the electrical interface is a 50 ohm transmission line, as known in the art. The 50 ohm transmission line comprises conductive pads 102 and 106 which are connected to the ground plane through vias 116 and 118, respectively. The electrical interface also includes a center conductor 104. This complement of conductive pads is designed to make contact with the RF probe of external test equipment designed to test the IC 120. Such devices are well known in the art and therefore require no additional discussion at this time.

Connected to the center conductor 104 of the electrical interface is a first inductive element 108. In accordance with the preferred embodiment, the first inductive element 108 is a transmission line (microstrip) segment. As will be appreciated, the transmission line segment 108 comprises a distributed low-pass structure having an input A and an output B, as shown in FIG. 3b.

When the external test equipment probe is not in contact with the electrical interface, the transmission line segment 108 will act like a shunt capacitor comprising the parallel plate capacitance of contacts 102, 104 and 106, along with the distributive capacitance $C_P$ of the transmission line segment 108. The parallel plate capacitance of contacts 102, 104 and 106 is determined in accordance with equations (3)–(6), below.

Figure 3B:
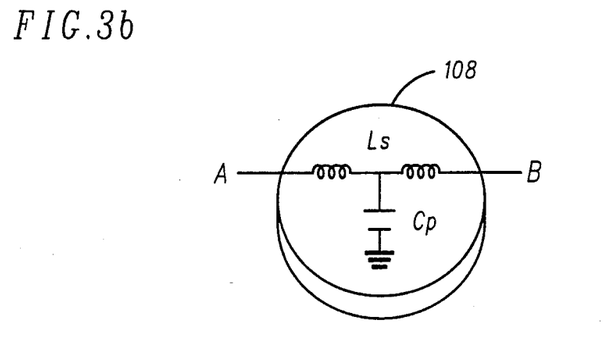
FIG. 3b depicts a schematic diagram equivalent circuit of an inductive element.

When the external test equipment probe (not shown) makes contact with the electrical interface 102,104,106 an impedance is provided at the input A of the transmission line segment 108 in accordance with FIG. 3b. As previously mentioned, the impedance is typically 50 ohms, however, different impedances values may be employed without departing from the spirit of the present invention.

With a 50 ohm termination impedance, the transmission line segment 108 will act like a series inductor having an inductance $L_S$, which can be approximated by the transmission line segment with its electrical length in degrees and given by the following equations:

$$\phi = 180(L_s\omega_2)/(\pi Z_{OH}) \quad (1)$$

where $\omega_2$ is the frequency of operation and $Z_{OH}$ is the highest realizable characteristic impedance.

In accordance with the preferred embodiment the first inductive element 108 has an inductance specifically selected to simulate the reactance of wire bonds when attached to electrical contacts 110,112, after the IC 120 and associated RF test equipment interfaces 150 are separated from the wafer 100 and packaged as an individual component. In accordance therewith, the transmission line segment inductor 108 has an inductance of approximately 0.15 nH. Of course, this value must be changed as the length of the later to be attached wire bonds differ. In accordance with the preferred embodiment, the later to be attached wire bonds are approximately 40 mils long.

In series with the first inductive element 108 is a second inductive element 114. As depicted in FIGS. 2 and 3a, the second inductive element 114 is a spiral inductor. Such components are well known in the art and will not be further discussed at this time. For additional information on spiral inductors, the interested reader is encouraged to refer to "Analysis of Square-Spiral Inductors for Use in MMICs", by P. R. Shepard, IEEE Trans. Microwave Theory and Tech., Vol. MTT-34, No. 4, April 1986, pp. 467–472; and "Design of Planar Rectangular Microelectronic Inductors", by H. M. Greenhouse, IEEE Trans. Parts, Hybrid and Packaging Vol. PHP-10, June 1974, pp. 101–109.

In circuit with the first and second series inductive elements 108 and 114 are electrical wire bond contact pads 110 and 112. These wire bond contacts are disposed on the first surface of the wafer 100 and provide electrical contact between the IC 120 and external circuitry (not shown), after the IC 120 has been separated from the wafer 100. During wafer level testing, however, electrical wire bond contact 110,112 in conjunction with the the plated back plane on the second surface 103 of the wafer 100, comprise microstrip line parallel plate capacitors. The capacitance of a microstrip line capacitor having a length L and a width W is determined by the following equations:

$$C = \frac{\epsilon_0\epsilon_r WL}{h} + 2C_{e1} + 2C_{e2} \quad (3)$$

where $C_{e1}$ and $C_{e2}$ are edge capacitances given by:

$$C_{e1} = \frac{1}{2}\left[\frac{1}{v_1 Z_1(W, h, \epsilon_r)} - \frac{\epsilon_0\epsilon_r W}{h}\right]L \quad (4)$$

and $$C_{e2} = \frac{1}{2}\left[\frac{1}{v_2 Z_2(L, h, \epsilon_r)} - \frac{\epsilon_0\epsilon_r L}{h}\right]W \quad (5)$$

In equations (4) and (5), $v_1$ and $v_2$ are phase velocities, $Z_1$ and $Z_2$ are characteristic impedances of the microstrip lines of width W and L, respectively. Thus, for a square shaped capacitor where (L=W) and $v_1 v_2$ and $Z_1 = Z_2$, $$C_{e1} = C_{e2} = \frac{1}{2}\left[\frac{W}{vZ(W, h, \epsilon_r)} - \frac{\epsilon_0\epsilon_r W^2}{h}\right] \quad (6)$$

Since the back plane comprises one of the plates of the parallel plate capacitors comprising electrical wire bond contacts 110 and 112, each capacitor acts like a shunt capacitor in circuit with series inductive elements 108 and 114. Together, series inductive elements 108 and 114 and shunt capacitance 110,112 combine to define a Tee type low-pass matched filter structure at the input 121 and output 123 of the IC 120, when the RF probe of an external test equipment fixture contacts the electrical interface 102,104,106.

In accordance with the preferred embodiment the spiral inductor 114 inductance and the shunt capacitor 110,112 capacitance are specifically selected to provide an impedance characteristic which is substantially equivalent to the impedance characteristic of the IC under test. As suggested, this impedance characteristic is typically 50 ohms.

For RF testing in the DC-20 GHz range, the inventors suggest that the second inductor 114 be approximately 0.3 nH, with 110 and 112 providing approximately 0.1 pf of shunt capacitance. For RF testing in higher frequency ranges, the suggested values must be lowered. A general rule states, the higher the frequency of operation, the lower the inductance and capacitance provided by the second series inductor 114 and shunt capacitance 110,112.

Figure 3C:
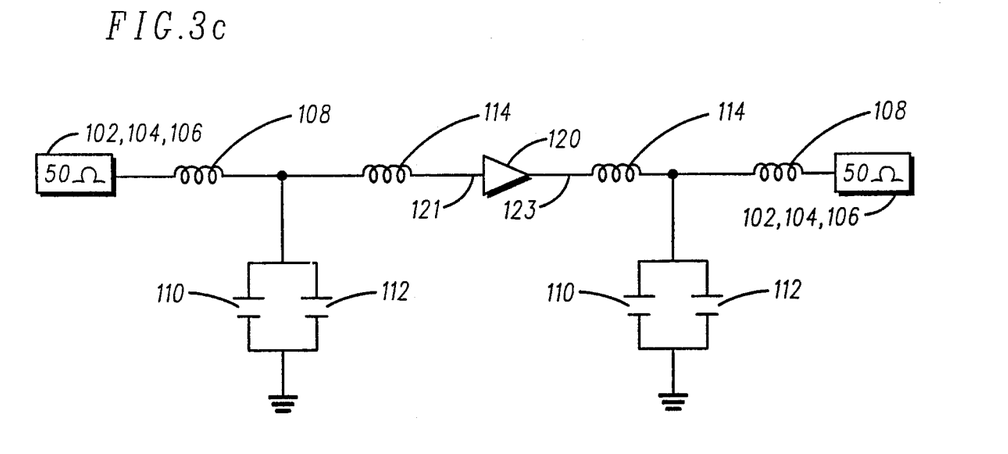

Referring to FIG. 3c, a schematic diagram equivalent circuit of the RF test equipment and wire bond interface circuit 150 of FIG. 3a is shown. In accordance therewith, a 50 ohm transmission line 102,104,106 is shown connected in series with the first inductive element 108. The first inductive element 108 is connected in series with the second inductive element 114. In circuit with the first 108 and second 114 series inductive elements are shunt capacitors 110,112. Together, the interface 102,104,106 comprising 50 ohms, the first series inductive element 108 comprising 0.15 nH, the second series inductive element 114 comprising 0.3 nH and the shunt capacitors 110,112 comprising 0.1 pf combine to define an impedance matched Tee type low-pass filter having a determinable transfer characteristic. The 50 ohm termination announces that the RF test equipment probe (not shown) is in contact with the electrical interface 102,104,106.

The formation of a Tee type low-pass matched filter structure utilizing inductive element 108, assures the on-wafer performance of the IC 120 will be substantially in accordance with the off-wafer performance of the IC 120 with attached wire bonds. This is due in part to the fact that the first inductive element 108 has a reactance $L_S$, which simulates the reactance of wire bonds when attached to electrical contacts 110,112, after the IC 120 is separated from the wafer 100.

While the first inductive element 108 is depicted as a segment of transmission line, it will be appreciated by those skilled in the art that the first inductive element 108 may comprise any suitable discrete component capable of providing the reactance $L_S$, which simulates the reactance of the later to be attached wire bonds. Such components include but are not limited to: transmission line segments, spiral inductors, coiled windings and various transistor based active components.

In a similar fashion, the second inductive element 114, while described as a spiral inductor, may nonetheless comprise any device in the above-provided list, which is capable of producing the requisite inductance.

Figure 4A:
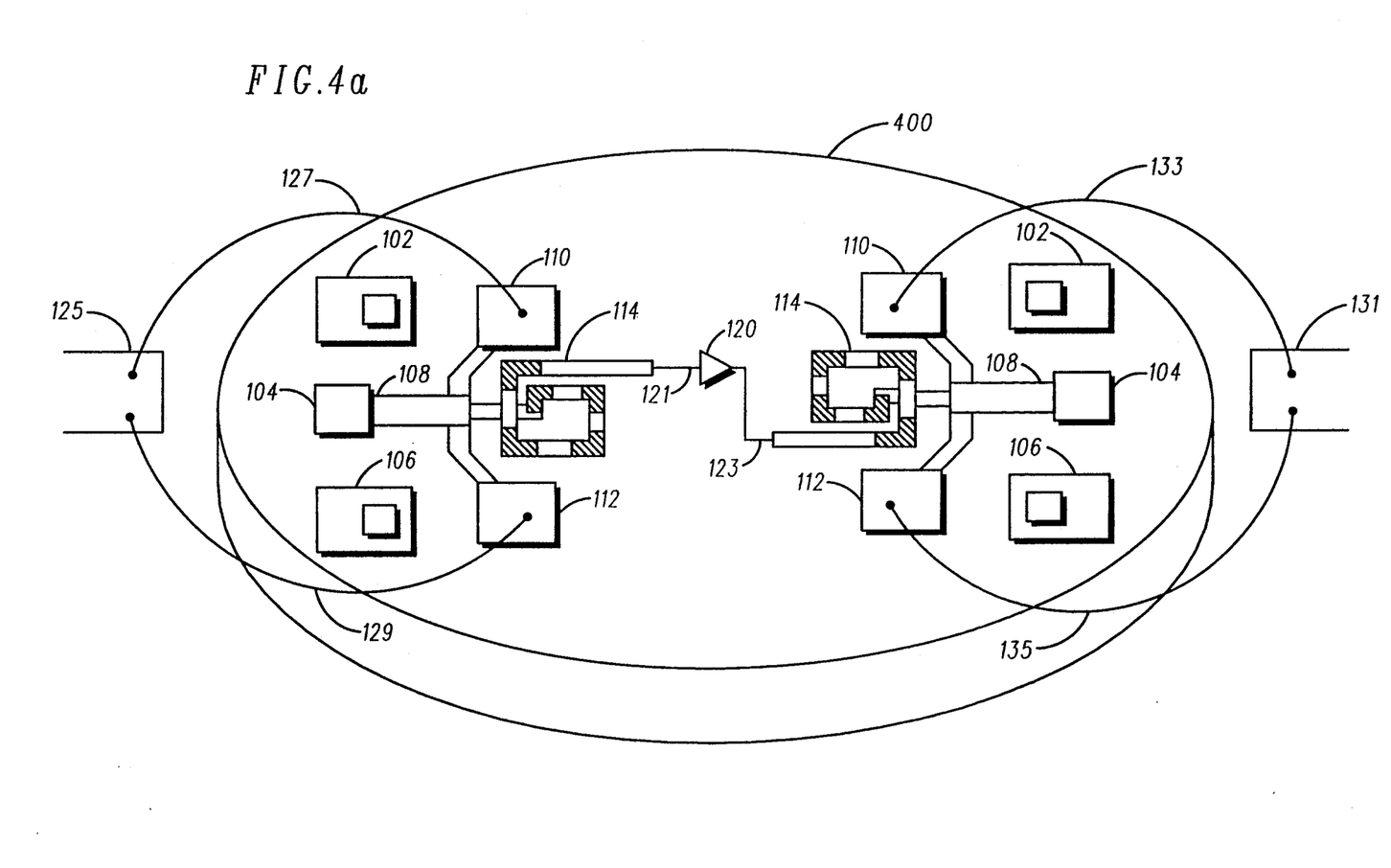
FIG. 4a depicts the RF test equipment and wire bond interface circuit of FIG. 3a at the next level of assembly.

Referring to. FIG. 4a, the RF test equipment and wire bond interface circuit of FIG. 3a is shown at the next level of assembly. In accordance therewith, the IC 120 including RF test equipment and wire bond interface circuit 150 at the input 121 and the output 123 are separated from the wafer 100 and disposed on a dielectric portion thereof which is designated as 400. The input 121 is coupled to external circuitry 125 at electrical wire bond contacts 110 and 112 via wire bonds 127 and 129 and the second inductive element 114. The output 123 is coupled to external circuitry 131 at contacts 110 and 112 via wire bonds 133 and 135 and the second inductive element 114. As previously mentioned, wire bonds 127,129 and 133,135 are each approximately 40 mils long.

When connected in this fashion, the two wire bond connections 127,129 and 133,135 respectively, form the first series inductors of a Tee type low-pass matched filter. Each wire bond pair 127,129 and 133,135 provides a first series inductor comprising approximately 0.4 nH of inductance. The second inductive element 114 provides the second series inductor of the Tee type low pass structure and comprises approximately 3 nH of inductance. The capacitance of electrical wire bond contacts 110 and 112, in addition to the capacitance provided by contacts 102,104,106 and the distributive capacitance, $C_P$, associated with first inductive element 108, combine to provide the 0.15 pf of shunt capacitance needed to complete the Tee type low-pass matched filter structure in accordance with the present invention. The formation of this low-pass matched filter structure by wire bond connections and increased shunt capacitance, permits the off-wafer performance of the IC 120 to mirror its on-wafer performance. This is due in part to the fact that the on-wafer and off-wafer transfer characteristic of the resultant low-pass matched filter structures are developed to be substantially similar.

Figure 4B:
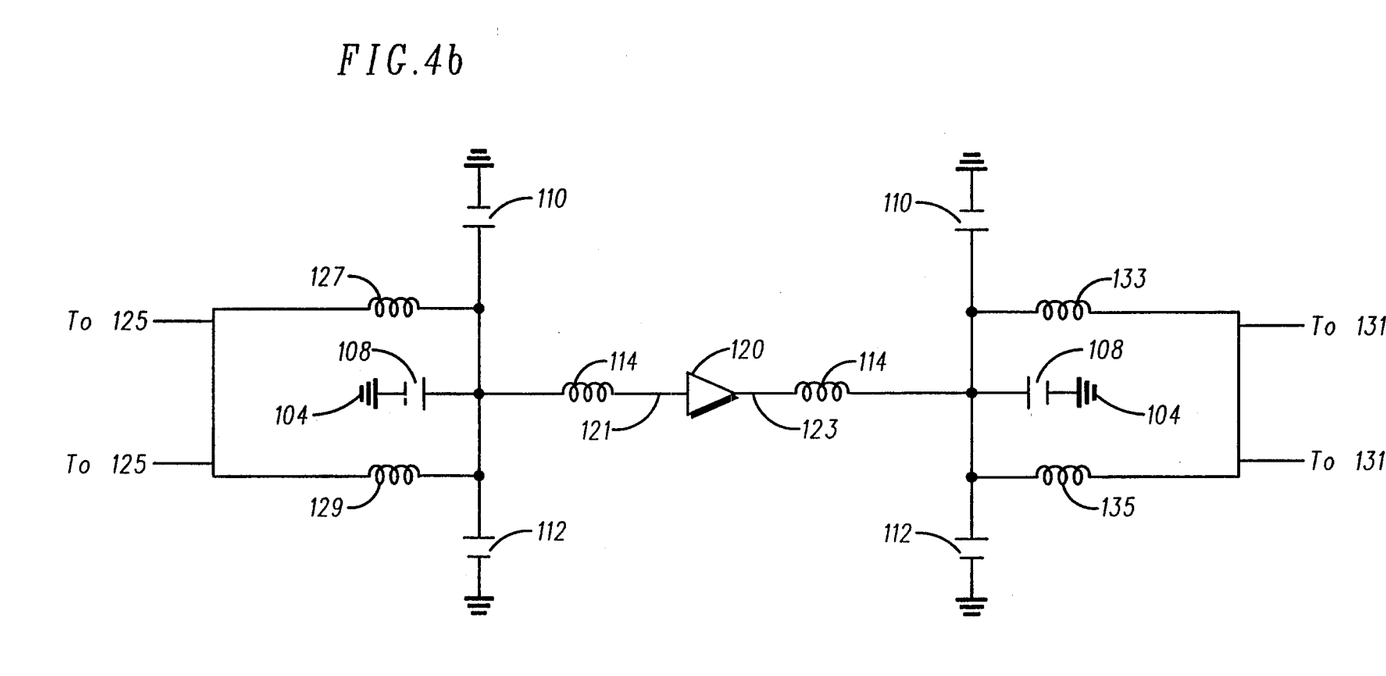

Referring to FIG. 4b a schematic diagram equivalent circuit of the RF test equipment and wire bond interface circuit of FIG. 4a is shown. The schematic diagram equivalent circuit of FIG. 4b conforms with the description provided under FIG. 4a. As previously mentioned, the transmission line segment 108 will now act like a shunt capacitor comprising the parallel plate capacitance of contacts 102,104,106 along with the distributive capacitance $C_P$ of the transmission line segment 108, due to the absence of the the external test equipment probe. It will be appreciated that the associated increase in the shunt capacitance is required in order to maintain impedance matching and to assure that the transfer characteristic of the low-pass structure of FIGS. 4a and 4b is substantially similar to the transfer characteristic of the low-pass structure of FIGS. 3a and 3c, despite the increased inductance added by wire bond pairs 127,129 and 133,135. According to the inventors, substantially similar transfer characteristics mean that the on-wafer and off-wafer electrical performance of the IC 120 will not vary by more than 0.5 dB in gain

What is claimed is:

1. An RF test equipment and wire bond interface circuit, disposed on a dielectric wafer, for facilitating the on-wafer testing of integrated circuits (IC) formed on said dielectric wafer, prior to the IC's separation from the wafer, said interface circuit comprising:

electrical interface means, disposed on the dielectric wafer, for providing electrical coupling between external test equipment and an IC under test; and a low pass filter structure, disposed on the dielectric wafer, between the electrical interface means and the IC under test, said low pass filter structure having a reactance which simulates a wire bond reactance, thereby providing similar on-wafer and off-wafer performance of the IC.

2. The circuit of claim 1 wherein the electrical interface means, the IC under test and the low pass filter structure are disposed upon the dielectric wafer, to form an IC assembly, such that when the IC is removed from the wafer, the RF test equipment and wire bond interface circuit remains a part of the IC assembly.

3. The circuit of claim 2 wherein the dielectric wafer comprises a plurality of ICs, each connected to at least one RF test equipment and wire bond interface circuit.

4. The circuit of claim 1 wherein the electrical interface means is a 50 ohm transmission line.

5. The circuit of claim 1 wherein the low pass filter structure is a device selected from the group consisting of L-C circuits and Tee type low-pass filters.

6. An RF test equipment and wire bond interface circuit, disposed on a dielectric wafer, for facilitating the on-wafer testing of integrated circuits (ICs) formed on the dielectric wafer, prior to the IC's separation from the wafer, said interface circuit comprising:

electrical interface means, disposed on the wafer, for providing electrical coupling between external test equipment and an IC under test; and a low pass filter structure, disposed on the wafer between the electrical interface means and the IC under test, for providing simulated wire bond reactance, said low pass filter structure comprising:

a first inductive element connected in series with the electrical interface means for simulating said wire bond reactance, a second inductive element connected in series with the first inductive element for making contact with the IC under test, and at least one capacitor connected between ground and a point common to both the first and the second inductive elements for providing shunt capacitance, such that when the external test equipment makes contact with the electrical interface means, RF testing with simulated wire bond reactance is provided, thereby assuring similar on-wafer and off-wafer performance of the IC.

7. The circuit of claim 6 wherein the electrical interface means, the IC under test and the low pass filter structure are disposed upon the dielectric dielectric wafer to form an IC assembly, such that when the IC is removed from the wafer, the RF test equipment and wire bond interface circuit remains coupled to the removed IC.

8. The circuit of claim 6 wherein the at least one capacitor is a parallel-plate capacitor, wherein plates of the parallel-plate capacitor are formed from electrical contacts on parallel surfaces of the dielectric wafer.

9. The circuit of claim 6 wherein the first inductive element has an inductive reactance simulating an inductive reactance of wire bonds as attached to the IC, when the IC is separated from the wafer and packaged at a next level of assembly.

10. An RF test equipment and wire bond interface circuit, disposed on a dielectric wafer, for facilitating the on-wafer testing of integrated circuits (IC) formed on said dielectric wafer, said RF test equipment and wire bond interface circuit comprising:

an electrical interface means, disposed on a surface of the dielectric wafer, for providing electrical coupling between external test equipment and an IC under test; and a matching circuit, disposed on a surface of the wafer, between the electrical interface means and the IC under test, for providing impedance matching and simulated wire bond reactances, said matching circuit comprising:

a first inductive element, connected in series with the electrical interface means, for simulating said v˙re bond reactances, a second inductive element, connected in series with the first inductive element, for making contact with the IC under test, and at least one electrical wire bond contact, coupled between ground and a point common to both the first and the second inductive elements, for providing wire bond contact and shunt capacitance, such that when the external test equipment makes contact with the electrical interface means, a low-pass filter structure which simulates wire bond reactance is provided during RF testing.

11. The circuit of claim 10 wherein the second inductive element has an inductance which when combined with the capacitance of the electrical wire bond contact, provides an impedance characteristic which is substantially equivalent to an impedance characteristics of the IC.

12. The circuit of claim 10 wherein at a next level of assembly, at least one IC including at least one RF test equipment and wire bond interface circuit is separated from the wafer.

13. The circuit of claim 12 further comprising wire bonds connected to the electrical wire bond contact to provide electrical coupling between the IC and external circuitry.

14. The circuit of claim 13 wherein the wire bonds have an inductance in series with the inductance of the second inductive element.

15. The circuit of claim 14 further comprising:

a Tee type low pass filter comprising:

the wire bond inductance in series with the second inductive elements inductance, in combination with shunt capacitance from the electrical wire bond contact, the electrical interface means and the first inductive elements distributive capacitance.

16. The circuit of claim 15 wherein the first inductive elements distributive capacitance, the electrical interface means capacitance and the electrical wire bond capacitance, when combined with the second inductive element's inductance, provides an impedance characteristic which is substantially equivalent to an impedance characteristic of the IC.

17. An RF test equipment and wire bond interface circuit, disposed on a substrate, for facilitating the on-substrate testing of integrated circuits (IC) formed on the substrate, said circuit comprising:

an electrical interface means, disposed on a surface of the substrate, for providing electrical coupling between external test equipment and an IC under test; and a matching circuit, disposed on a surface of the substrate between the electrical interface means and the IC under test, for providing impedance matching and simulated wire bond reactance, said matching circuit comprising:

a first inductive element, connected in series with the electrical interface means, for simulating wire bond reactances, a second inductive element, connected in series with the first inductive element, for making contact with the IC under test, and an electrical wire bond contact, coupled between ground and a point common to both the first and the second inductive elements, for providing shunt capacitance and wire bond contact to external circuitry, such that when the external test equipment makes contact with the electrical interface means, a low-pass filter structure having a first transfer characteristic is provided during RF testing, further; when the IC under test is removed from the substrate and wire bonds are attached between the electrical wire bond contact and external circuitry, a low-pass filter structure having a second transfer characteristic is provided during IC packaging, wherein said second transfer characteristic is substantially similar to the first transfer characteristic, thereby assuring similar on-wafer and off-wafer performance of the IC.

* * * * *